(12) United States Patent
Takeda

(10) Patent No.: US 12,068,114 B2
(45) Date of Patent: Aug. 20, 2024

(54) BOARD TERMINAL ELECTRODE COMPONENT

(71) Applicant: Murata Manufacturing Co., Ltd., Nagaokakyo (JP)

(72) Inventor: Motonori Takeda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 154 days.

(21) Appl. No.: 17/690,074

(22) Filed: Mar. 9, 2022

(65) Prior Publication Data

US 2022/0293346 A1 Sep. 15, 2022

(30) Foreign Application Priority Data

Mar. 12, 2021 (JP) .................. 2021-040588

(51) Int. Cl.
| | |
|---|---|
| *H01G 4/30* | (2006.01) |
| *H01G 2/06* | (2006.01) |
| *H01G 4/232* | (2006.01) |
| *H05K 1/11* | (2006.01) |
| *H05K 1/18* | (2006.01) |

(52) U.S. Cl.
CPC ............. *H01G 4/30* (2013.01); *H01G 2/065* (2013.01); *H01G 4/232* (2013.01); *H05K 1/111* (2013.01); *H05K 1/181* (2013.01); *H05K 2201/09381* (2013.01)

(58) Field of Classification Search
CPC ........................................................ H01G 4/30
USPC ........................................................ 361/767
See application file for complete search history.

(56) References Cited

U.S. PATENT DOCUMENTS 6,143,992 A * 11/2000 Sato ..................... H05K 3/3436
 361/767
2022/0071021 A1* 3/2022 Shigeta .................. H05K 1/181

FOREIGN PATENT DOCUMENTS

CN 201911141112 A * 11/2019
JP 04-125987 A 4/1992

* cited by examiner

*Primary Examiner* — Stanley Tso
(74) *Attorney, Agent, or Firm* — Keating & Bennett, LLP

(57) ABSTRACT

A board terminal electrode component includes a board, and a pair of land pads spaced apart from each other on a surface of the substrate. The pair of land pads respectively include inner ends which are proximal to each other in an arrangement direction, and outer ends farther from each other in the arrangement direction than the inner ends. The pair of land pads respectively include expanding width portions expanding in a width direction from the inner end toward the outer end. The pair of land pads respectively include insulators on a surface of an end portion of the outer end of the land pads.

19 Claims, 10 Drawing Sheets

BOARD TERMINAL ELECTRODE COMPONENT

CROSS REFERENCE TO RELATED APPLICATIONS

This application claims the benefit of priority to Japanese Patent Application No. 2021-040588 filed on Mar. 12, 2021. The entire contents of this application are hereby incorporated herein by reference.

BACKGROUND OF THE INVENTION

1. Field of the Invention

The present invention relates to a board terminal electrode component.

2. Description of the Related Art

Conventionally, as a structure that mounts a two-terminal electrode component such as a multilayer ceramic capacitor or an inductor on a circuit board, a structure has been known in which a pair of external electrodes of the two-terminal electrode components are respectively provided at a pair of electrode pads provided at a predetermined distance on the surface of the circuit board, and soldered therewith (for example, refer to Japanese Unexamined Patent Application Publication No. H04-125987).

When the sizes of the two-terminal electrode components to be mounted on the board differ, it is necessary to change the distance between the electrode pads on the circuit board accordingly. In this case, although it is possible to replace the circuit board itself, there is room for improvement because the manufacturing cost increases and the replacement is not efficient.

SUMMARY OF THE INVENTION

Preferred embodiments of the present invention provide board terminal electrode components that are each able to mount two-terminal electrode components of different sizes, reduce the manufacturing cost, and allow efficient use.

According to a preferred embodiment of the present invention, a board terminal electrode component includes a board, and a pair of land pads spaced apart from each other on a surface of the substrate, wherein the pair of land pads respectively include inner ends proximal to each other in an arrangement direction, and outer ends farther from each other in the arrangement direction than the inner ends, the pair of land pads respectively include expanding width portions gradually expanding in a width direction from the inner end towards the outer end, and the pair of land pads respectively include insulators on a surface of an end portion of the outer end.

According to a preferred embodiment of the present invention, a board terminal electrode component includes a board, and a pair of land pads spaced apart from each other on a surface of the substrate, wherein the pair of land pads respectively include inner ends proximal to each other in an arrangement direction, and outer ends farther from each other in the arrangement direction than the inner ends, and the pair of land pads respectively include expanding width portions gradually expanding in a width direction from the inner end towards the outer end.

According to a preferred embodiment of the present invention, a board terminal electrode component includes a board, and a pair of land pads spaced apart from each other on a surface of the substrate, wherein the pair of land pads respectively include inner ends proximal to each other in an arrangement direction, and outer ends farther from each other in the arrangement direction than the inner ends, and the pair of land pads respectively include insulators on a surface of an end portion of the outer end.

According to preferred embodiments of the present invention, it is possible to provide board terminal electrode components that are each able to mount two-terminal electrode components of different sizes, reduce the manufacturing cost, and allow for efficient use.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described below with reference to the drawings.

First Preferred Embodiment

Figure 1:
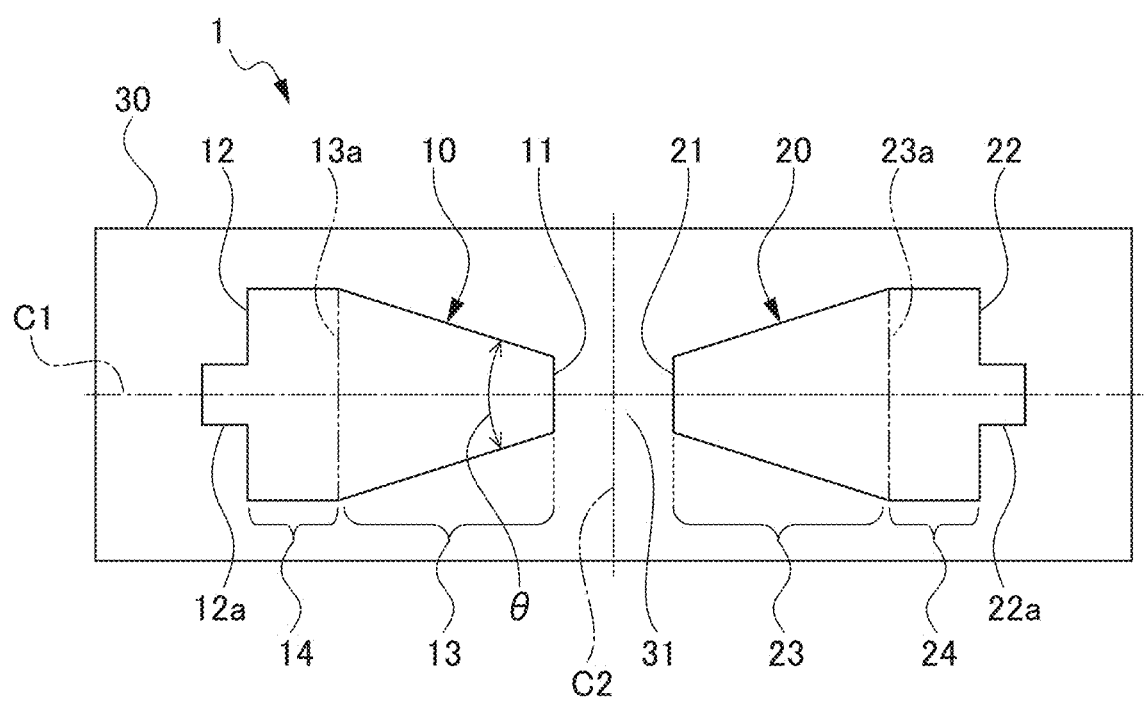
FIG. 1 is a plan view showing a board terminal electrode component of a first preferred embodiment of the present invention.

FIG. 1 is a plan view showing a board terminal electrode component 1 according to a first preferred embodiment of the present invention. The board terminal electrode component 1 is provided on a circuit board (not shown), for example, such that a predetermined two-terminal electrode component is mounted.

As shown in FIG. 1, the board terminal electrode component 1 includes a board 30 which has a rectangular or substantially rectangular shape in a plan view and is made of an insulating material, and a first land pad 10 and a second land pad 20 as a pair of land pads provided on the surface of the board 30. The length direction of the board 30 is the length direction of the board terminal electrode component 1, and defined as a lateral direction in FIG. 1. The length direction referred to below is based on the length direction of the board 30, and the width direction refers to a direction perpendicular or substantially perpendicular to the length direction of the board.

The first land pad 10 and the second land pad 20 are electrode pads in which a conductive material is provided in a film shape on the surface of the board 30. The first land pad 10 and the second land pad 20 are provided on the surface of the board 30 and spaced apart from each other in the length direction. A separation portion 31 is provided between the first land pad 10 and the second land pad 20 on the surface of the board 30, where the surface of the board 30 is exposed. The separation portion 31 is located at the middle or approximate middle in the length direction of the board 30. The arrangement direction described below is a direction in which the first land pad 10 and the second land pad 20 are arranged, and is the same direction as the length direction. Furthermore, the inner side in the length direction referred to below is a side adjacent to or in a vicinity of the separation portion 31 in the length direction, and the outer side in the length direction is a side spaced away from the separation portion 31 in the length direction.

The first land pad 10 includes an inner end 11 proximal to the second land pad 20 in the arrangement direction, and an outer end 12 which is located closer to the outer side in the length direction than the inner end 11, and is spaced away from the second land pad 20. In the first preferred embodiment, a protruding portion 12a protruding outward in the length direction from the outer end 12 is provided at the middle or approximate middle in the width direction of the outer end 12. Each of the inner end 11 and outer end 12 extends along the width direction. The first land pad 10 has a symmetrical or substantially symmetrical shape with the center line C1 in the width direction as the center of symmetry.

The first land pad 10 includes an expanding width portion 13 adjacent to or in the vicinity of the inner end 11 in the length direction, and also includes a fixed width portion 14 adjacent to or in the vicinity of the outer end 12 of the expanding width portion 13. The expanding width portion 13 has a trapezoidal or substantially trapezoidal shape which widens gradually toward the outer end 12 from the inner end 11. The inner end 11 is provided at the end of the inner side in the length direction of the expanding width portion 13. The expanding width portion 13 is evenly or substantially evenly spread from the inner side to the outer side in the length direction. In the first preferred embodiment, the spread angle θ of the expanding width portion 13 is, for example, about 20 degrees or more and about 60 degrees or less. However, the present invention is not limited thereto.

The fixed width portion 14 has a rectangular or substantially rectangular shape with the same width as an end portion 13a of the outer side in the length direction of the expanding width portion 13. The end portion 13a has the maximum width of the expanding width portion 13. The fixed width portion 14 is continuous with the expanding width portion 13. The outer end 12 is provided at the end portion of the outer side in the length direction of the fixed width portion 14. Although the length of the fixed width portion 14 of the present preferred embodiment is set to be shorter than the length of the expanding width portion 13, the present invention is not limited to such a configuration.

The second land pad 20 has a symmetrical or substantially symmetrical shape with the first land pad 10 with the center line C2 in the length direction of the board 30 as a center of symmetry. That is, similarly to the first land pad 10, the second land pad 20 includes an inner end 21 adjacent to or in the vicinity of the first land pad 10 in the arrangement direction, and an outer end 22 spaced away from the inner end 21 in the arrangement direction. A protruding portion 22a protruding outward in the length direction is provided at the outer end 22.

The second land pad 20 includes an expanding width portion 23 and a fixed width portion 24 which are the same as or similar to the expanding width portion 13 and the fixed width portion 14 of the first land pad 10. The expanding width portion 23 has a trapezoidal or substantially trapezoidal shape which widens gradually toward the outer end 22 from the inner end 21. The fixed width portion 24 has a rectangular or substantially rectangular shape with the same or substantially the same width as the end portion 23a of the outer side in the length direction of the expanding width portion 23. The end portion 23a has the maximum width of the expanding width portion 23. The symmetry with the center line C2 shown in FIG. 1 in the following description as the center of symmetry may also be referred to as left-right symmetry.

In the board terminal electrode component 1 according to the first preferred embodiment, each electrode of the electronic component having a chip size is joined by soldering and mounted to each of the expanding width portion 13 of the first land pad 10 and the expanding width portion 23 of the second land pad 20. In the present preferred embodiment, any of the electronic component S1 having a small size shown in FIGS. 2A and 2B, the electronic component M1 having a medium size shown in FIGS. 3A and 3B, and the electronic component L1 having a large size shown in FIGS. 4A and 4B can be joined to the board terminal electrode component 1.

The electronic component S1, the electronic component M1, and the electronic component L1 of the present preferred embodiment are, for example, multilayer ceramic capacitors, each having a rectangular or substantially rectangular parallelepiped shape, and are each a two-terminal electrode component including external electrodes at both ends in the length direction of a body portion having a rectangular or substantially rectangular parallelepiped shape.

Figure 2A:
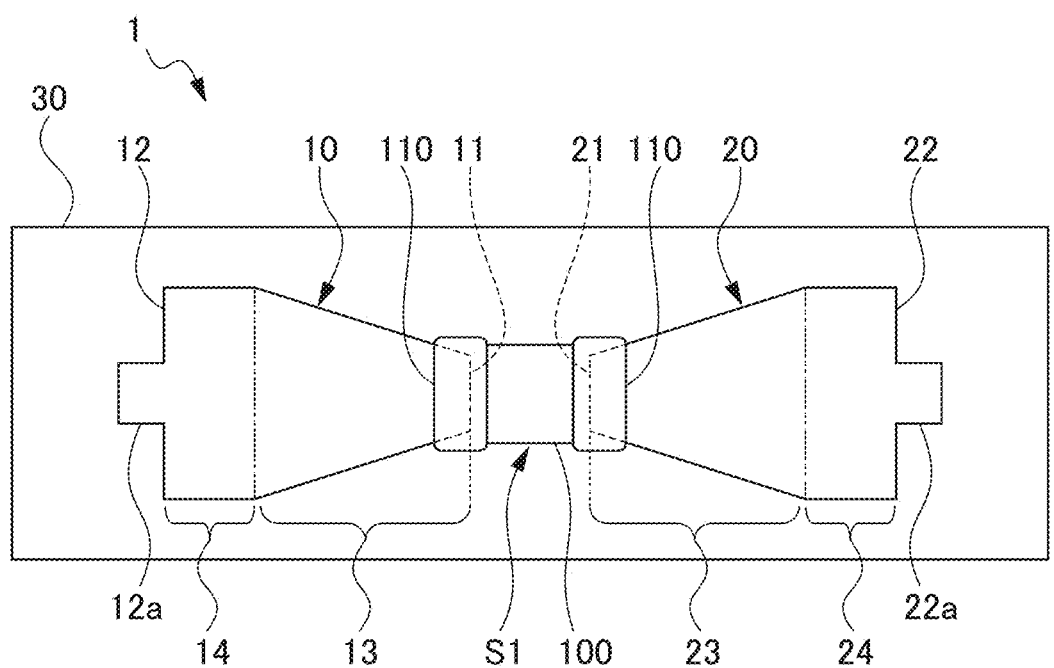
FIG. 2A is a plan view showing a state in which an electronic component having a small size is mounted on the board terminal electrode component of the first preferred embodiment of the present invention.
Figure 2B:
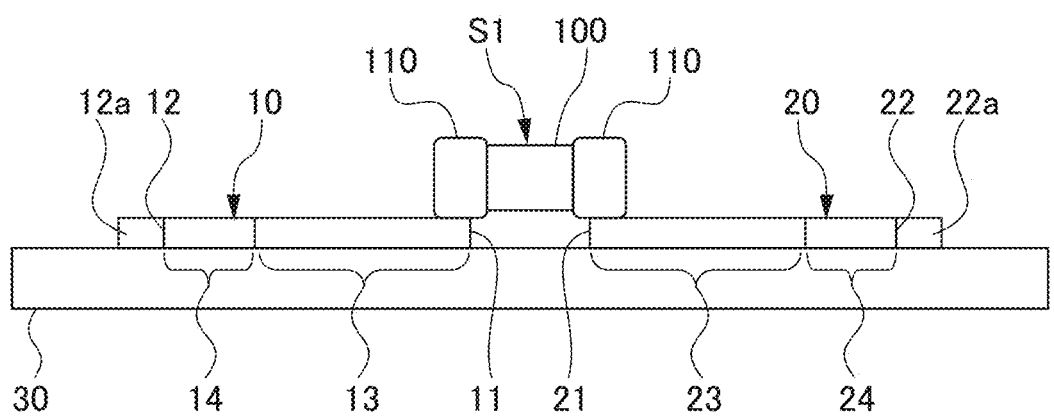
FIG. 2B is a side view showing a state in which the electronic component having a small size is mounted on the board terminal electrode component of the first preferred embodiment of the present invention.
Figure 3A:
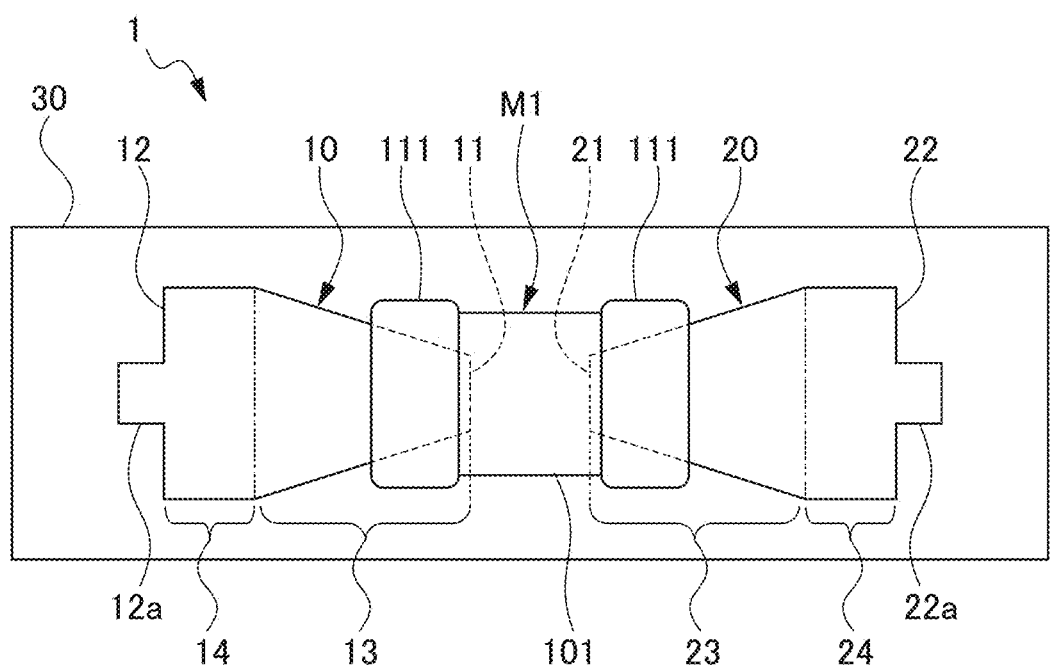
FIG. 3A is a plan view showing a state in which an electronic component having a medium size is mounted on the board terminal electrode component of the first preferred embodiment of the present invention.
Figure 3B:
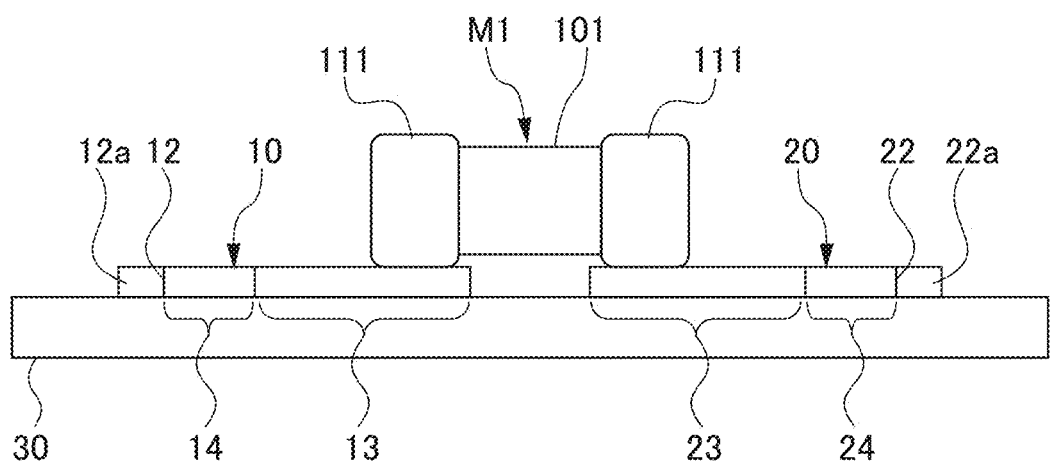
FIG. 3B is a side view showing a state in which the electronic component having a medium size is mounted on the board terminal electrode component of the first preferred embodiment of the present invention.
Figure 4A:
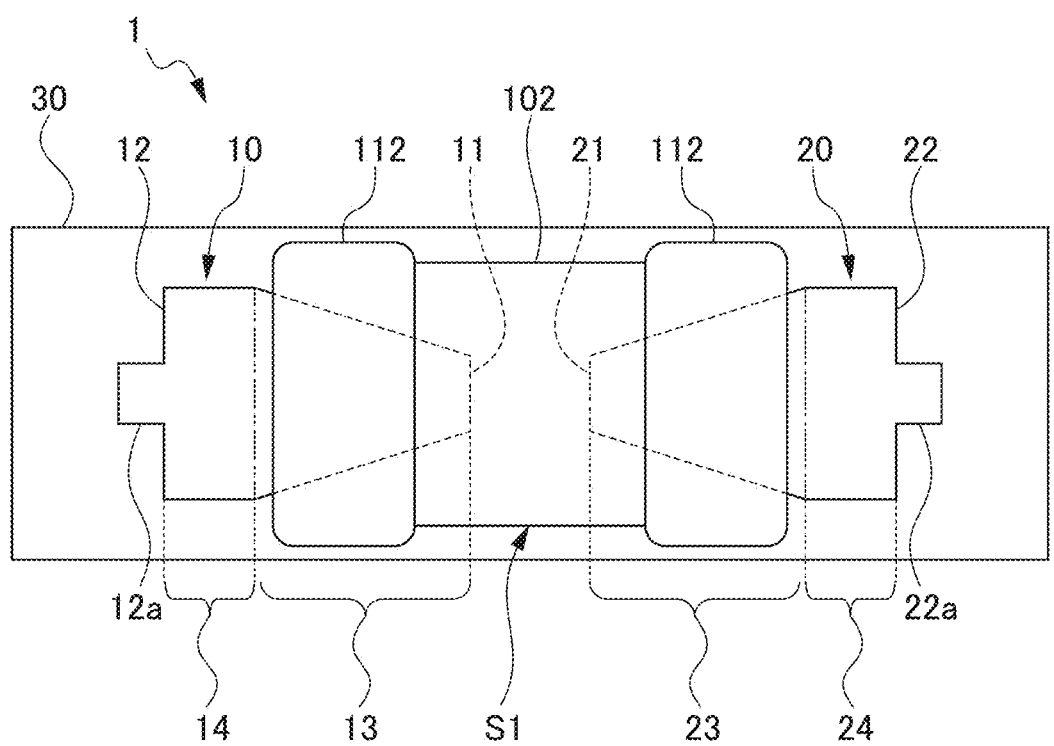
FIG. 4A is a plan view showing a state in which an electronic component having a large size is mounted on the board terminal electrode component of the first preferred embodiment of the present invention.
Figure 4B:
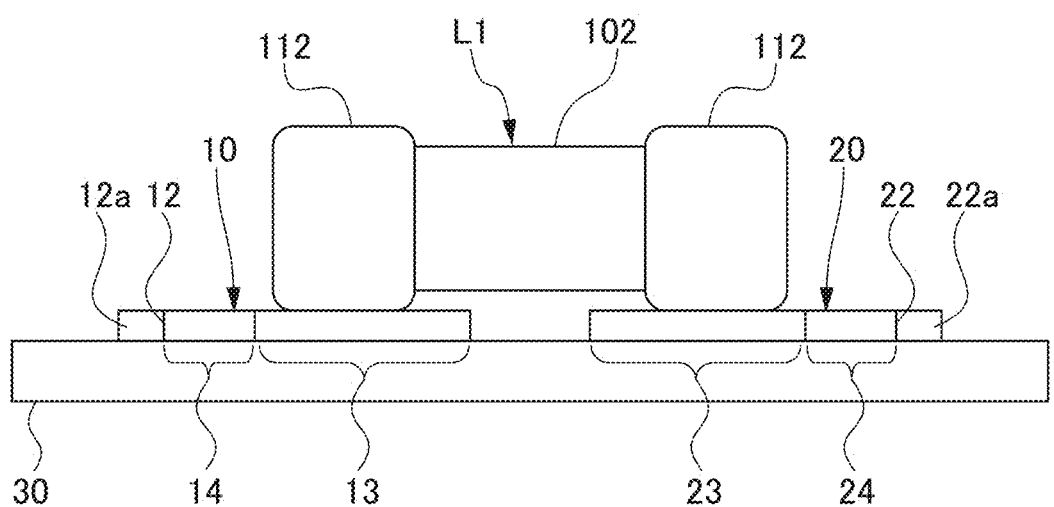
FIG. 4B is a side view showing a state in which the electronic component having a large size is mounted on the board terminal electrode component of the first preferred embodiment of the present invention.

As shown in FIGS. 2A and 2B, the electronic component S1 includes a main body portion 100, and a pair of external electrodes 110 which are respectively provided on both ends of the main body portion 100 in the length direction. As shown in FIGS. 3A and 3B, the electronic component M1 includes a main body portion 101, and a pair of external electrodes 111 which are respectively provided on both ends of the main body portion 101 in the length direction. As shown in FIGS. 4A and 4B, the electronic component L1 includes a main body portion 102, and a pair of external electrodes 112 which are respectively provided on both ends of the main body portion 102 in the length direction.

The sizes of the electronic component S1, the electronic component M1, and the electronic component L1 are larger in this order in the overall size including the lengths in the length direction, the width direction, and the height direction. Furthermore, the sizes of the external electrode 110 of the electronic component S1, the external electrode 111 of the electronic component M1, and the external electrode 112 of the electronic component L1 are larger in this order in the sizes including the lengths in the length direction and the width direction.

As shown in FIGS. 2A and 2B, the electronic component S1 bridges between the first land pad 10 and the second land pad 20. In the electronic component S1, one of the external electrodes 110 is provided on the surface of the end portion of the inner side in the length direction of the expanding width portion 13 of the first land pad 10. The other external electrode 110 is provided on the surface of the end portion of the inner side in the expanding width portion 23 of the second land pad 20. The distance between the end portions of the inner sides of the expanding width portion 13 and the expanding width portion 23 in the length direction where the external electrode 110 is provided corresponds to the distance between the pair of external electrodes 110 of the electronic component S1. The distance between the end portions is set such that each of the pair of external electrodes 110 can be provided. In the present preferred embodiment, the pair of external electrodes 110 of the electronic component S1 bridge over the inner end 11 and the inner end 21 on the expanding width portion 13 and the expanding width portion 23.

The width of the external electrode 110 of the electronic component S1 is larger than the width of the region where the external electrode 110 is provided in the expanding width portion 13 and the expanding width portion 23. Thus, the region of the expanding width portion 13 and the expanding width portion 23 where the external electrode 110 is provided is covered with the external electrodes 110, and thus not exposed in the width direction.

The electronic component S1 is provided symmetrically or substantially symmetrically such that the joining area between the external electrodes 110, and the expanding width portion 13 and the expanding width portion 23 is equal or substantially equal. Furthermore, the electronic component S1 is provided such that the center in the width direction coincides or substantially coincides with the center of the board 30 in the width direction.

As shown in FIGS. 3A and 3B, the electronic component M1 bridges between the first land pad 10 and the second land pad 20. In the electronic component M1, one of the external electrodes 111 is provided on the surface of the end portion of the inner side in the length direction of the expanding width portion 13 of the first land pad 10. The other external electrode 111 is provided on the surface of the end portion of the inner side in the length direction of the expanding width portion 23 of the second land pad 20. The distance between the ends of the inner side in the length direction of each of the expanding width portion 13 and the expanding width portion 23 where the external electrodes 111 are provided corresponds to the distance between the pair of external electrodes 111 of the electronic component M1. The distance between the ends is set such that each of the pair of external electrodes 111 can be provided. In the present preferred embodiment, the pair of external electrodes 111 of the electronic component M1 cover the region over a position proximal to each of the inner end 11 and the inner end 21 from positions slightly to the inner side from the center in the length direction of the expanding width portion 13 and the expanding width portion 23.

The width of the external electrode 111 of the electronic component M1 is larger than the width of the region where the external electrode 111 is provided in the expanding width portion 13 and the expanding width portion 23. Thus, the region of the expanding width portion 13 and the expanding width portion 23 where the external electrodes 111 are provided is covered with the external electrode 111, and thus not exposed in the width direction.

The electronic component M1 is provided symmetrically or substantially symmetrically such that the joining area between the external electrodes 111, and the expanding width portion 13 and the expanding width portion 23 is equal or substantially equal. Furthermore, the electronic component M1 is provided such that the center in the width direction coincides or substantially coincides with the center of the board 30 in the width direction.

As shown in FIGS. 4A and 4B, the electronic component L1 bridges between the first land pad 10 and the second land pad 20. In the electronic component L1, one of the external electrodes 112 is provided on the surface of the central or substantially central portion in the length direction of the expanding width portion 13 of the first land pad 10. The other external electrode 112 is provided on the surface of the central or substantially central portion in the length direction of the expanding width portion 23 of the second land pad 20. The distance between the central or substantially central portions in the length direction of each of the expanding width portion 13 and the expanding width portion 23 where the external electrodes 112 are provided corresponds to the distance between the pair of external electrodes 112 of the electronic component L1. The distance between the central or substantially central portions is set such that each of the pair of external electrodes 112 can be provided. In the present preferred embodiment, the pair of external electrodes 112 of the electronic component L1 cover the region over a position proximal to the end portions 13a and 23a on the outer sides in the length direction of the expanding width portion 13 and the expanding width portion 23 from the positions slightly to the inner side from the center in the length direction of the expanding width portion 13 and the expanding width portion 23.

The width of the external electrode 112 of the electronic component L1 is larger than the width of the region where the external electrode 112 is provided in the expanding width portion 13 and the expanding width portion 23. Thus, the region of the expanding width portion 13 and the expanding width portion 23 where the external electrode 112 are provided is covered with the external electrode 112, and thus not exposed in the width direction.

The electronic component L1 is provided symmetrically or substantially symmetrically such that the joining area between the external electrodes 112, and the expanding width portion 13 and the expanding width portion 23 is equal or substantially equal. Furthermore, the electronic component L1 is provided such that the center in the width direction coincides or substantially coincides with the center of the board 30 in the width direction.

The electronic components S1, the electronic component M1, and the electronic component L1 each having a different size respectively include the pair of external electrodes 110, the pair of external electrodes 111, and the pair of external electrodes 112. The pair of the external electrodes 110 can be joined to the expanding width portion 13 of the first land pad 10 and the expanding width portion 23 of the second land pad 20. The pair of the external electrodes 111 can be joined to the expanding width portion 13 of the first land pad 10 and the expanding width portion 23 of the second land pad 20.

The pair of the external electrodes 112 can be joined to the expanding width portion 13 of the first land pad 10 and the expanding width portion 23 of the second land pad 20. In the expanding width portion 13 and the expanding width portion 23 with which the external electrodes 110, the external electrodes 111, and the external electrodes 112 are joined, the widening angle θ shown in FIG. 1 is set such that the joining areas of the external electrodes 110, the external electrodes 111, and the external electrodes 112 are, for example, about 50% or more of these external electrodes to obtain sufficient joining areas.

The board terminal electrode component 1 according to the first preferred embodiment described above provides the following advantageous effects.

The board terminal electrode component 1 according to the first preferred embodiment includes the board 30, and the first land pad 10 and the second land pad 20 defining and functioning as the pair of land pads which are spaced apart from each other on the surface of the substrate 3, wherein the first land pad 10 and the second land pad 20 respectively include an inner end 11 and an inner end 21 which are proximal to each other in the arrangement direction, and an outer end 12 and an outer end 22 farther from each other in the arrangement direction than the inner ends 11 and 21, and the first land pad 10 and the second land pad 20 respectively include an expanding width portion 13 which gradually expands in the width direction from the inner end 11 towards the outer end 12, and an expanding width portion 23 which gradually expands in the width direction from the inner end 21 towards the outer end 22.

The expanding width portion 13 of the first land pad 10 and the expanding width portion 23 of the second land pad 20 respectively expand gradually from the inner end 11 toward the outer end 12 and from the inner end 21 toward the outer end 22 such that any of the external electrodes 110 of the electronic component S1, the external electrodes 111 of the electronic component M1, and the external electrodes 112 of the electronic component L1 having different sizes has appropriate joining areas. With such a configuration, it is possible to mount electronic components which differ in size with one board terminal electrode component 1. As a result, since it is possible to avoid the time and effort of making a plurality of board terminal electrode components corresponding to the electronic components having different sizes, it is possible to reduce or prevent the increase in manufacturing cost and efficiently use the board terminal electrode component 1.

In the board terminal electrode component 1 according to the first preferred embodiment, the first land pad 10 includes a width which is the same or substantially the same as the maximum width of the expanding width portion 13 on the outer end 12 of the expanding width portion 13, and includes the fixed width portion 14 which is continuous with the expanding width portion 13, and the second land pad 20 includes a width which is the same or substantially the same as the maximum width of the expanding width portion 23 on the outer end 22 of the expanding width portion 23, and includes the fixed width portion 24 which is continuous with the expanding width portion 23.

With such a configuration, it is possible to mount an electronic component which is longer than the electronic component L1 having a large size described above, and includes large external electrodes on both end portions, by providing the external electrodes on the fixed width portion 14 and the fixed width portion 24 of the first land pad 10.

Subsequently, a second preferred embodiment, a third preferred embodiment and a fourth preferred embodiment of the present invention will be described. In describing these preferred embodiments, the same or corresponding components as those of the first preferred embodiment are denoted by the same reference numerals, and descriptions thereof are omitted or simplified, and points mainly different from those of the first preferred embodiment will be described.

Second Preferred Embodiment

Figure 5:
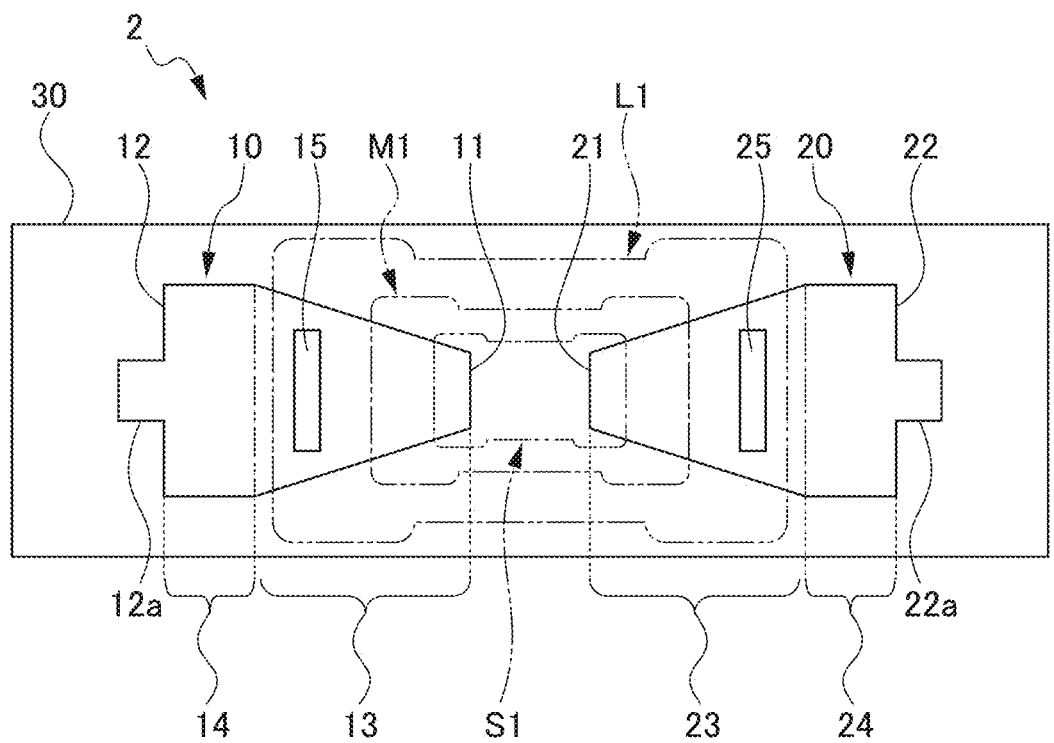
FIG. 5 is a plan view showing a board terminal electrode component of a second preferred embodiment of the present invention.

FIG. 5 is a plan view showing a board terminal electrode component 2 according to a second preferred embodiment of the present invention. Also in the board terminal electrode component 2, it is possible to mount any electronic component among the electronic component S1, the electronic component M1, and the electronic component L1 having different sizes as described above to the expanding width portion 13 of the first land pad 10 and the expanding width portion 23 of the second land pad 20.

In the second preferred embodiment, the expanding width portion 13 of the first land pad 10 includes a slit 15 provided therein. Similarly to this, the expanding width portion 23 of the second land pad 20 includes a slit 25 provided therein. The surface of the board 30 is exposed in the slit 15 and the slit 25.

In the second preferred embodiment, the slit 15 and the slit 25 extend along the width direction. Furthermore, the slit 15 is provided at a position in the vicinity of the outer side in the length direction of the expanding width portion 13 and has a relatively large width of the expanding width portion 13. Similarly, the slit 25 is provided at a position in the vicinity of the outer side in the length direction of the expanding width portion 23 and has a relatively large width of the expanding width portion 23.

The board terminal electrode component 2 according to the second preferred embodiment includes the board 30, and the first land pad 10 and the second land pad 20 defining and functioning as the pair of land pads spaced apart from each other on the surface of the substrate 30, wherein the first land pad 10 and the second land pad 20 respectively include an inner end 11 and an inner end 21 which are proximal to each other in the arrangement direction, and an outer end 12 and an outer end 22 farther from each other in the arrangement direction than the inner ends 11 and 21, and the first land pad 10 and the second land pad respectively include an expanding width portion 13 which gradually expands in a width direction from the inner end 11 towards the outer end 12, and an expanding width portion 23 which gradually expands in a width direction from the inner end 21 towards the outer end 22.

Thus, similarly to the first preferred embodiment, since it is possible to mount electronic components having different sizes, it is possible to reduce the increase in manufacturing cost and efficiently use the board terminal electrode component 2.

In the board terminal electrode component 2 of the second preferred embodiment, the first land pad 10 and the second land pad 20 respectively include the slits 15 and 25 from which surfaces of the substrate 30 are exposed.

With such a configuration, when a situation occurs in which stress is applied to the board 30 by a thermal variation or the like, for example, of the first land pad 10 and the second land pad 20, it is possible to alleviate the stress by the slit 15 and the slit 25, such that it is possible to reduce or prevent the deformation or the like of the board 30.

Third Preferred Embodiment

Figure 6:
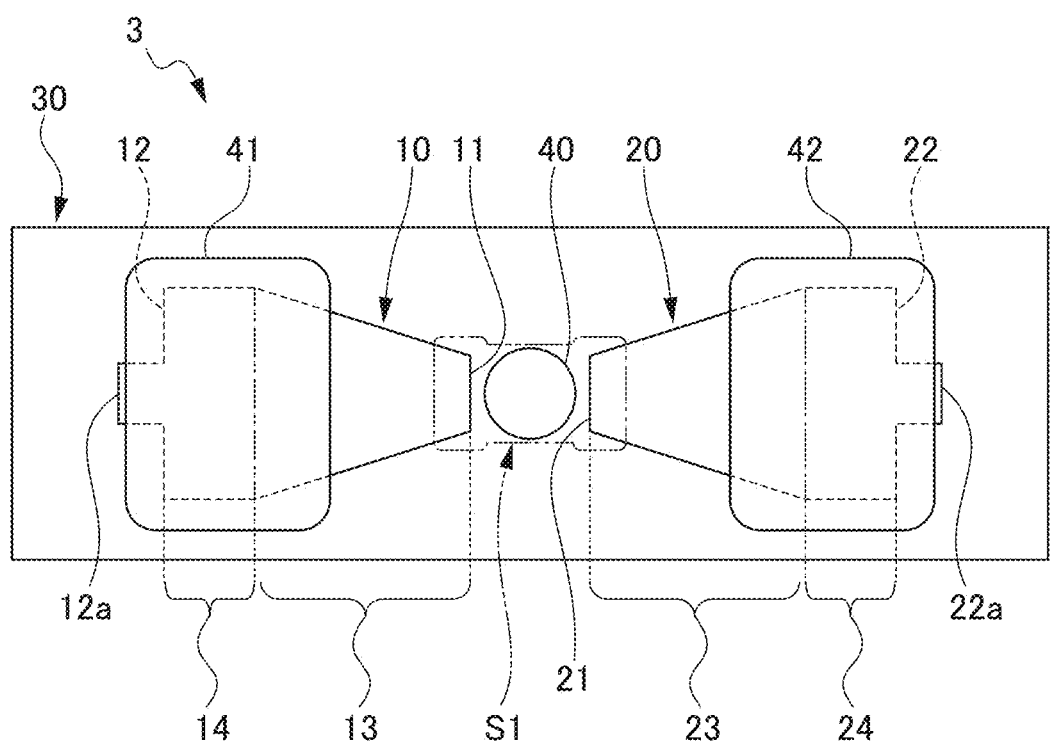
FIG. 6 is a plan view showing a board terminal electrode component of a third preferred embodiment of the present invention.

FIG. 6 is a plan view showing a board terminal electrode component 3 according to a third preferred embodiment of the present invention. In the third preferred embodiment, an insulator 41 is provided on the surface of the end portion of the outer end 12 of the first land pad 10, and similarly, an insulator 42 is provided on the surface of the end portion of the outer end 22 of the second land pad 20.

The insulator 41 has a rectangular or substantially rectangular shape. The insulator 41 covers the fixed width portion 14 of the first land pad 10, a portion of the expanding width portion 13 in the vicinity of the fixed width portion 14, and a portion of the protruding portion 12a. Similarly to the insulator 41, the insulator 42 covers the fixed width portion 24 of the second land pad 20, a portion of the expanding width portion 23 in the vicinity of the fixed width portion 14, and a portion of the protruding portion 22a.

Furthermore, in the third preferred embodiment, the surface of the board 30 includes an insulator 40 between the first land pad 10 and the second land pad 20. The insulator 40 has a circular or substantially circular shape, for example. However, the shape is not limited thereto.

The insulator 40, the insulator 41, and the insulator 42 of the present preferred embodiment has a film shape and includes a well-known insulating material. As an insulating material, for example, a resin for a solder resist such as an epoxy resin, an insulating coating material for a board including a resin such as a polyolefin resin, an acrylic resin, or a polyurethane resin as a main component, or the like is suitably used.

In the board terminal electrode component 3 of the third preferred embodiment, for example, it is possible to mount the electronic component S1 having a small size in the same or substantially the same manner as shown in the first preferred embodiment.

The board terminal electrode component 3 according to the third preferred embodiment includes the board 30, and the first land pad 10 and the second land pad 20 defining and functioning as the pair of land pads spaced apart from each other on the surface of the substrate 30, wherein the first land pad 10 and the second land pad 20 respectively include an inner end 11 and an inner end 21 which are proximal to each other in the arrangement direction, and an outer end 12 and an outer end 22 farther from each other in the arrangement direction than the inner ends 11 and 21, and the first land pad 10 and the second land pad 20 respectively include an expanding width portion 13 which gradually expands in width from the inner end 11 toward the outer end 12, and an expanding width portion 23 which gradually expands in width from the inner end 21 toward the outer end 22, and the first land pad 10 includes the insulator 41 on the surface of the end portion of the outer end 12 of the first land pad 10, and the second land pad 20 includes the insulator 42 on the surface of the end portion of the outer end 22 of the second land pad 20.

For example, when mounting the electronic component S1 to the board terminal electrode component 3, each of the pair of external electrodes 110 provided on the first land pad 10 and the second land pad 20 are soldered. However, it is not necessary to supply a solder in the region where the insulator 40, the insulator 41, and the insulator 42 are provided. In other words, the insulator 40, the insulator 41, and the insulator 42 are provided in a region where the supply of solder is not required, depending on the size of the electronic component S1. Thus, it is possible to supply an amount of solder as required, and thus it is possible to reduce the amount used of the solder and to prevent a short circuit.

Furthermore, in the board terminal electrode component 3 of the third preferred embodiment, it is possible to mount electronic components having different sizes, as in the first preferred embodiment, by adjusting the area of the insulator 41 and the insulator 42, and by adjusting the exposed region of the expanding width portion 13 of the first land pad 10 and the expanding width portion 23 of the second land pad 20. Therefore, it is possible to reduce or prevent an increase in manufacturing cost, and to efficiently use the board terminal electrode component 3.

Fourth Preferred Embodiment

Figure 7:
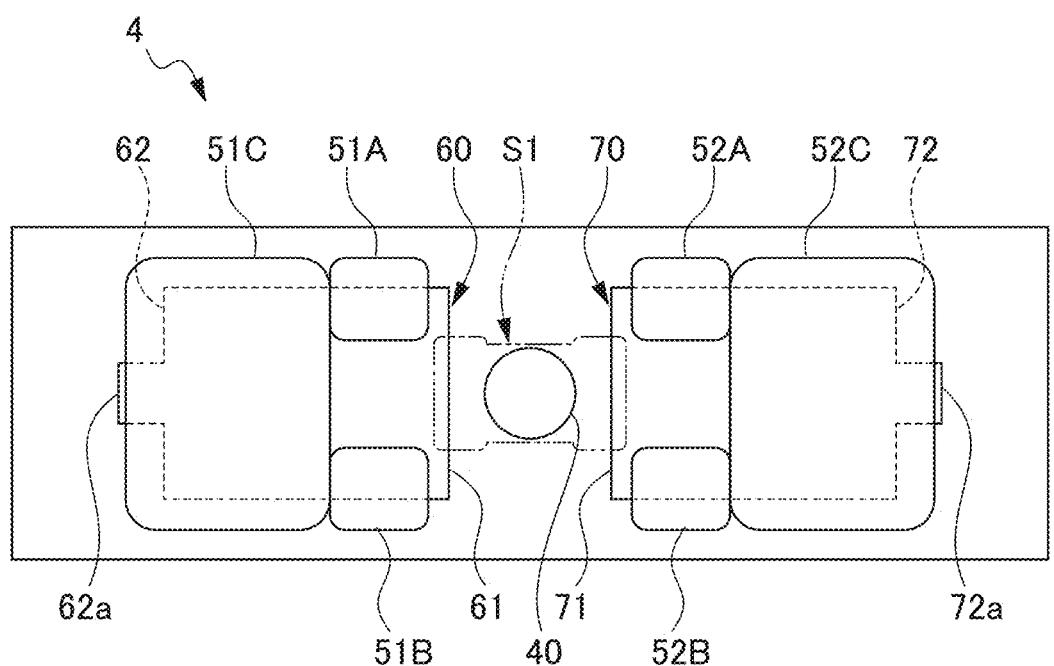
FIG. 7 is a plan view showing a board terminal electrode component of a fourth preferred embodiment of the present invention.

FIG. 7 is a plan view showing a board terminal electrode component 4 according to a fourth preferred embodiment of the present invention. In the fourth preferred embodiment, a first land pad 60 is provided on the surface of the board 30 instead of the first land pad 10 of the first preferred embodiment, and a second land pad 70 is provided on the surface of the board 30 instead of the second land pad 20 of the first preferred embodiment.

The first land pad 60 has a rectangular or substantially rectangular shape. The first land pad 60 includes an inner end 61 proximal to the second land pad 70 in the arrangement direction, and an outer end 62 which is located closer to the outer side in the length direction than the inner end 61, and is provided at a position spaced away from the second land pad 70. A protruding portion 62a protruding outward in the length direction from the outer end 62 is provided at the middle or approximate middle in the width direction of the outer end 62. Each of the inner end 61 and outer end 62 extends along the width direction.

The second land pad 70 has a rectangular or substantially rectangular shape provided symmetrically or substantially symmetrically with the first land pad 60, and similarly to the first land pad 60, includes an inner end 71 proximal to the first land pad 60 in the arrangement direction, and an outer end 72 which is provided at a position spaced away from the inner end 71 in the arrangement direction. A protruding portion 72a protruding outward in the length direction is provided at the outer end 72.

In the fourth preferred embodiment, an insulator 51C covering the surface of the board 30 is provided at a portion including the end portion of the outer end 62 of the first land pad 60. Furthermore, in the fourth preferred embodiment, a pair of insulators 51A and the insulator 51B covering the surface of the board 30 are spaced apart from each other in the width direction at a portion including the end portion of the inner end 61 of the first land pad 60.

The insulator 51C has a rectangular or substantially rectangular shape, and covers the surface of the outer end 62 of the first land pad 60 from a position slightly closer to the inner end 61 than the middle in the length direction of the first land pad 60, to a portion of the protruding portion 62a.

The pair of insulators 51A and 51B have a rectangular or substantially rectangular shape, and have the same or substantially the same shape and size. The insulator 51A and the insulator 51B are adjacent to each other, and are spaced apart from each other in the width direction, such that the insulator 51A and the insulator 51B are respectively provided across both edges of the first land pad 60 in the width direction. The edges of the inner sides in the length direction of the insulator 51A and the insulator 51B do not extend to the inner end 61, and thus the surface of the board 30 is exposed between the insulator 51A and the insulator 51B, and the inner end 61.

In the fourth preferred embodiment, similarly to the first land pad 60, an insulator is provided at the second land pad 70. That is, an insulator 52C is provided at the portion including the end portion of the outer end 72 of the second land pad 70, and the pair of the insulator 52A and the insulator 52B are spaced apart from each other in the width direction at the portion including the end portion of the inner end 71 of the second land pad 70. The insulator 52A, the insulator 52B, and the insulator 52C are provided symmetrically or substantially symmetrically with the insulator 51A, the insulator 51B, and the insulator 51C on the side of the first land pad 60.

The insulator 51A, the insulator 51B, and the insulator 51C on the side of the first land pad 60, and the insulator 52A, the insulator 52B, and the insulator 52C on the side of the second land pad 70 are made of, for example, a resin defining and functioning solder resist or an insulating coating material for a board described above.

Furthermore, in the fourth preferred embodiment, similarly to the third preferred embodiment, the insulator 40 is provided on the surface of the board 30 between the first land pad 60 and the second land pad 70.

In the board terminal electrode component 4 of the fourth preferred embodiment, for example, it is possible to mount the electronic component S1 having a small size. The electronic component S1 is provided between the insulator 51C of the first land pad 60 and the insulator 52C of the second land pad 70, and the electronic component S1 is mounted such that one of the pair of external electrodes 110 is provided and soldered near the inner end 61 of the first land pad 60, and the other of the pair of external electrodes 110 is provided and soldered near the inner end 71 of the second land pad 70.

The board terminal electrode component 4 of the fourth preferred embodiment has a size which allows any of the electronic component M1 having a middle size and the electronic component L1 having a large size described in the first preferred embodiment to be mounted to the first land pad 60 and the second land pad 70. In such a case, an insulator is provided at a portion excluding the region where the external electrode 111 of the electronic component M1 or the external electrode 112 of the electronic component L1 is joined.

The board terminal electrode component 4 according to the fourth preferred embodiment includes the board 30, and the first land pad 60 and the second land pad 70 defining and functioning as the pair of land pads spaced apart from each other on the surface of the substrate 30, wherein the first land pad 60 and the second land pad 70 respectively include an inner end 61 and an inner end 71 which are proximal to each other in the arrangement direction, and an outer end 62 and an outer end 72 farther from each other in the arrangement direction than the inner ends 61 and 71, and the first land pad 60 includes the insulator 51C provided on the surface of the end portion of the outer end 62 of the first land pad 60, and the second land pad 70 includes the insulator 52C provided on the surface of the end portion of the outer end 72 of the second land pad 70.

For example, when mounting the electronic component S1 to the board terminal electrode component 4, each of the pair of external electrodes 110 provided on the first land pad 60 and the second land pad 70 are soldered. However, it is not necessary to supply a solder in the region where the insulator 51A, the insulator 51B, and the insulator 51C of the first land pad 60, the insulator 52A, the insulator 52B, and the insulator 52C of the second land pad 70, and the insulator 40 are provided. In other words, depending on the size of the electronic component S1, the insulator 51A, the insulator 51B, and the insulator 51C, the insulator 52A, the insulator 52B, the insulator 52C, and the insulator 40 are provided in the region where the supply of solder is not required. Thus, it is possible to supply an amount of solder as required, and it is possible to reduce the amount of the solder used and to prevent a short circuit.

Furthermore, in the board terminal electrode component 4 of the fourth preferred embodiment, it is possible to mount electronic components having different sizes, as in the first preferred embodiment, by adjusting the area of the insulator 51A, the insulator 51B, the insulator 51C, the insulator 52A, the insulator 52B, and the insulator 52C, or by adjusting the exposed region of the first land pad 60 and the second land pad 70 by selectively omitting the arrangement. Therefore, it is possible to reduce or prevent an increase in manufacturing cost and to efficiently use the board terminal electrode component 4.

While the exemplary first to fourth preferred embodiments have been described above, the present invention is not limited to these preferred embodiments, and variations, improvements, and the like within a scope achieving the advantageous effects of preferred embodiments of the present invention are included in the present invention. For example, the size and shape of the first and second land pads as a pair of land pads may be any size or any shape as long as a plurality of electronic components of different sizes can be soldered. Also, similarly to this, the size and shape of the insulator covering the surface of each land pad to limit the supply of solder is appropriately designed so as to correspond to the electronic components. The multilayer ceramic capacitor described as an electronic component mounted on the board terminal electrode component according to the first to fourth preferred embodiments of the present invention is an example of a two-terminal electrode component, and the present invention is also applicable to other two-terminal electrode components such as, for example, an inductor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A board terminal electrode component comprising:
   a board; and
   a pair of land pads spaced apart from each other on a surface of the board; wherein
   the pair of land pads respectively include inner ends proximal to each other in an arrangement direction, and outer ends farther from each other in the arrangement direction than the inner ends;
   the pair of land pads respectively include expanding width portions gradually expanding in a width direction from the inner end toward the outer end;
   the pair of land pads respectively include insulators, each on a surface of an end portion of the outer end; and
   the insulators are spaced-apart from the inner ends.

2. The board terminal electrode component according to claim 1, wherein the pair of land pads respectively include slits from which surfaces of the board are exposed.

3. The board terminal electrode component according to claim 1, wherein the pair of land pads each include a width equal to a maximum width of the expanding width portion on the outer end of the expanding width portion, and each include a fixed width portion continuous with the expanding width portion.

4. The board terminal electrode component according to claim 3, wherein the fixed width portion has a rectangular shape.

5. The board terminal electrode component according to claim 1, wherein the board includes an insulator on a surface of the board between the pair of land pads.

6. The board terminal electrode component according to claim 1, wherein the pair of land pads are symmetrical with a center line in a length direction of the board.

7. A board terminal electrode component comprising:
a board; and
a pair of land pads spaced apart from each other on a surface of the board; wherein
the pair of land pads respectively include inner ends proximal to each other in an arrangement direction, and outer ends farther from each other in the arrangement direction than the inner electrodes;
the pair of land pads respectively include expanding width portions expanding in a width direction from the inner end toward the outer end;
the pair of land pads each include a width equal to a maximum width of the expanding width portion on the outer end of the expanding width portion, and each include a fixed width portion continuous with the expanding width portion; and
a width of the fixed width portion is equal to the maximum width of the expanding width portion.

8. The board terminal electrode component according to claim 7, wherein a spread angle of each of the expanding width portions is 20 degrees or more and 60 degrees or less.

9. The board terminal electrode component according to claim 7, wherein the pair of land pads respectively include slits from which surfaces of the board are exposed.

10. The board terminal electrode component according to claim 7, wherein the board includes an insulator on a surface of the board between the pair of land pads.

11. The board terminal electrode component according to claim 7, wherein the fixed width portion has a rectangular shape.

12. The board terminal electrode component according to claim 7, wherein the pair of land pads are symmetrical with a center line in a length direction of the board.

13. A board terminal electrode component comprising:
a board; and
a pair of land pads spaced apart from each other on a surface of the board; wherein
the pair of land pads respectively include inner ends proximal to each other in an arrangement direction, and outer ends farther from each other in the arrangement direction than the inner ends;
the pair of land pads respectively include insulators on a surface of an end portion of the outer end; and
the insulators are spaced-apart from the inner ends.

14. The board terminal electrode component according to claim 13, wherein a spread angle of each of the expanding width portions is 20 degrees or more and 60 degrees or less.

15. The board terminal electrode component according to claim 13, wherein the pair of land pads respectively include slits from which surfaces of the board are exposed.

16. The board terminal electrode component according to claim 13, wherein the pair of land pads each include a width equal to a maximum width of the expanding width portion on the outer end of the expanding width portion, and each include a fixed width portion continuous with the expanding width portion.

17. The board terminal electrode component according to claim 16, wherein the fixed width portion has a rectangular shape.

18. The board terminal electrode component according to claim 13, wherein the board includes an insulator on a surface of the board between the pair of land pads.

19. The board terminal electrode component according to claim 13, wherein the pair of land pads are symmetrical with a center line in a length direction of the board.

* * * * *